United States Patent
Li et al.

(10) Patent No.: US 11,493,461 B1
(45) Date of Patent: Nov. 8, 2022

(54) WETTABILITY ESTIMATION USING T2 DISTRIBUTIONS OF WATER IN WETTING AND NON-WETTING PHASES

(71) Applicants: Baoyan Li, Tomball, TX (US); Hasan Kesserwan, Al-Khobar (SA)

(72) Inventors: Baoyan Li, Tomball, TX (US); Hasan Kesserwan, Al-Khobar (SA)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 17/360,009

(22) Filed: Jun. 28, 2021

(51) Int. Cl.
   *G01N 24/08* (2006.01)
   *G01N 13/00* (2006.01)
   *G01R 33/50* (2006.01)

(52) U.S. Cl.
   CPC ........... *G01N 24/081* (2013.01); *G01N 13/00* (2013.01); *G01R 33/50* (2013.01)

(58) Field of Classification Search
   CPC ....... G01N 24/081; G01N 13/00; G01R 33/50
   See application file for complete search history.

(56) References Cited

U.S. PATENT DOCUMENTS

| | | | |
|---|---|---|---|
| 9,746,576 B2 * | 8/2017 | Jebutu | G01V 3/32 |
| 11,131,186 B1 * | 9/2021 | Al-Garadi | G01V 3/14 |
| 2020/0264331 A1 * | 8/2020 | Venkataramanan | G01V 3/32 |

* cited by examiner

*Primary Examiner* — Gregory H Curran
(74) *Attorney, Agent, or Firm* — Cantor Colburn LLP

(57) ABSTRACT

A method of estimating a wettability characteristic of a rock material includes acquiring a plurality of T2 distributions based on nuclear magnetic resonance (NMR) measurements of a rock material under a plurality of fluid saturated rock conditions, constructing a measurement matrix based on the plurality of T2 distributions, and performing non-negative factorization of the measurement matrix to determine feature components. The method also includes reconstructing the plurality of T2 distributions based on the feature components, and extracting a first set of T2 distributions associated with mobile water under a wetting condition and a second set of T2 distributions associated with mobile water under a non-wetting condition based on the feature components, and calculating a wettability index (WI) based on the first extracted set of T2 distributions and the second extracted set of T2 distributions.

20 Claims, 15 Drawing Sheets

WETTABILITY ESTIMATION USING T2 DISTRIBUTIONS OF WATER IN WETTING AND NON-WETTING PHASES

BACKGROUND

Understanding the characteristics of geologic formations and fluids located therein is important for effective hydrocarbon exploration and production. For example, accurate estimation of the wetting characteristics of in-situ reservoir fluids is important for evaluation of hydrocarbon recovery, selection of production mechanisms and analysis of field development economics.

Magnetic resonance tools can be used to estimate characteristics of formations, such as porosity, permeability and fluid characteristics. Such tools can be conveyed into a borehole during drilling (e.g., as logging-while-drilling tools) or after drilling (e.g., as wireline tools). In addition, magnetic resonance measurements on core samples can provide valuable insight into properties of rocks and fluids. Characterization of the formations and the fluids within provides valuable information related to the intended use of the formation so that drilling and production resources can be used efficiently.

SUMMARY

An embodiment of a method of estimating a wettability characteristic of a rock material includes acquiring a plurality of T2 distributions based on nuclear magnetic resonance (NMR) measurements of a rock material under a plurality of fluid saturated rock conditions, constructing a measurement matrix based on the plurality of T2 distributions, and performing non-negative factorization of the measurement matrix to determine feature components. The method also includes reconstructing the plurality of T2 distributions based on the feature components, and extracting a first set of T2 distributions associated with mobile water under a wetting condition and a second set of T2 distributions associated with mobile water under a non-wetting condition based on the feature components, and calculating a wettability index (WI) based on the first extracted set of T2 distributions and the second extracted set of T2 distributions.

An embodiment of a system for estimating a wettability characteristic of a rock material includes a nuclear magnetic resonance (NMR) device configured to perform NMR measurements of a rock material, and a processor. The processor is configured to perform a method that includes acquiring a plurality of T2 distributions based on the NMR measurements of the rock material under a plurality of fluid saturated rock conditions, constructing a measurement matrix based on the plurality of T2 distributions, performing non-negative factorization of the measurement matrix to determine feature components, reconstructing the plurality of T2 distributions based on the feature components, and extracting a first set of T2 distributions associated with mobile water in a wetting condition and a second set of T2 distributions associated with mobile water in a non-wetting condition, and calculating a wettability index (WI) based on the first extracted set of T2 distributions and the second extracted set of T2 distributions.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1:
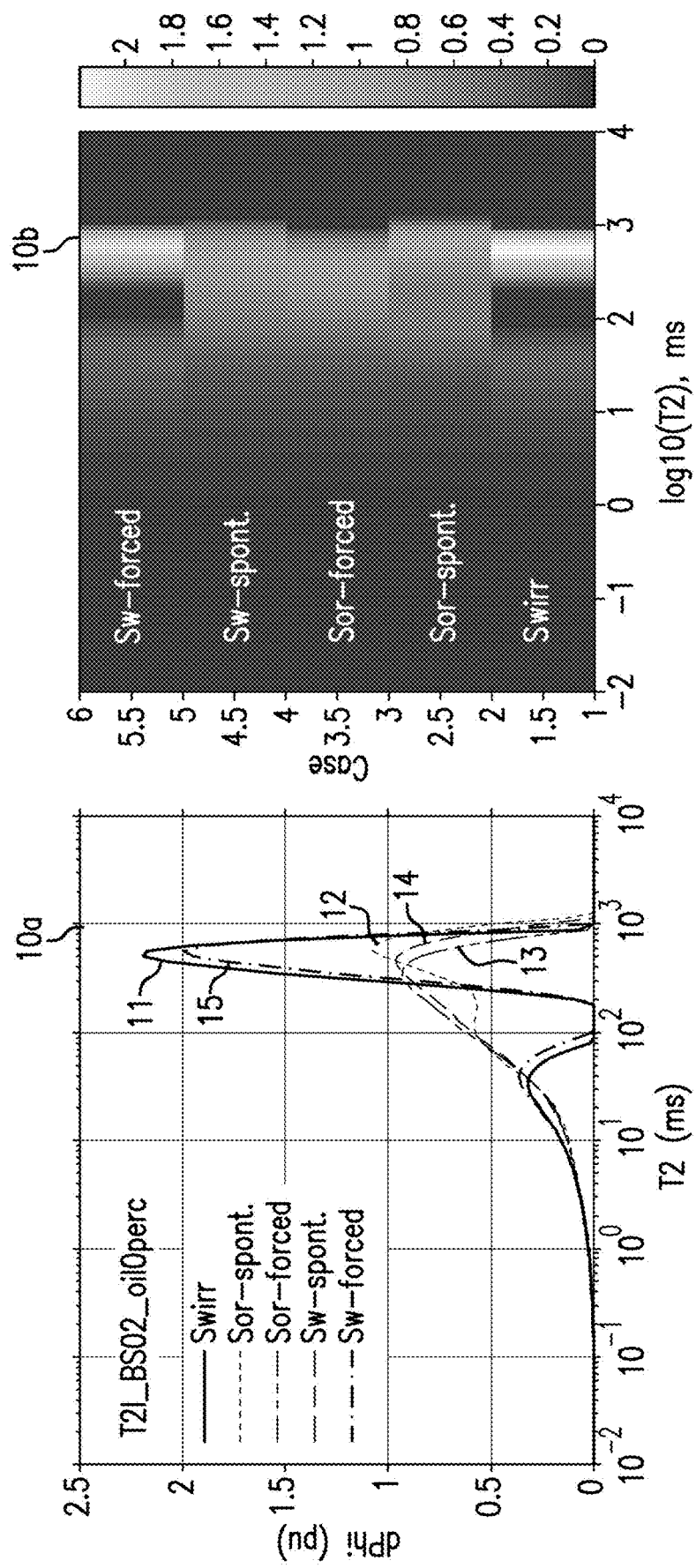
FIG. 1 depicts an example of raw T2 distributions derived from NMR measurements of a rock sample under a plurality of fluid conditions.

Apparatuses and methods for characterizing subterranean regions are described herein. An embodiment of a method includes determining wettability characteristics of a subterranean material (e.g., a downhole region or core sample) based on nuclear magnetic resonance (NMR) measurements. The wettability may be characterized as an index or other value. In an embodiment, the method characterizes wettability of a mixed wet rock material ("rock") using measured T2 distributions of mobile water in wetting and non-wetting phases of the mixed wet rock. The method is based on a recognition that mobile water can exist in both wetting phases and non-wetting phases of mixed wet rock. Embodiments may be applied to surface measurements (e.g., laboratory measurements of core samples) and/or downhole measurements (e.g., well logs). Embodiments may also be used to monitor changes of wettability of rock at a downhole condition.

An embodiment of a method of estimating a wettability characteristic includes performing NMR measurements and acquiring raw T2 distributions from a rock sample under a plurality of fluid conditions. Although embodiments are discussed in conjunction with a rock sample at a surface location, it is to be understood that acquiring raw T2 distribution and estimating wettability may be performed on subterranean rock material around a borehole, or on rock samples while such samples are in a borehole.

T2 distributions of mobile water, in an embodiment, are extracted using a feature analysis method to extract feature components from raw T2 distributions. "Raw" T2 distributions refer to distributions directly resulting from NMR echo train inversions. Examples of feature analysis methods include principal component analysis (PCA), independent component analysis (ICA), and non-negative matrix factorization methods (NNMF). For example, a machine learning algorithm is provided for generating a measurement matrix of the raw T2 distributions, performing NNMF to determine feature components, and using the feature components identified via NNMF to reconstruct or model the raw T2 distributions to generate modeled T2 distributions.

In an embodiment, a method such as PCA is performed to determine a number of (i.e., how many) factors having significant effects to variability of the raw T2 distributions. For example, PCA is performed in order to determine a numerical value corresponding to a number of feature components, i.e., how many feature components were identified. This value is used an input to a non-negative factorization of a measurement matrix, in order to extract the actual feature components. It is noted that, although the feature analysis method is described as NNMF, it is not so limited, as any suitable feature analysis method may be used.

Constituent T2 distributions are extracted from the modeled T2 distributions for different types of fluids (e.g., irreducible water, oil and mobile water). The extracted T2 distributions include extracted T2 distributions (one for each fluid condition) of mobile water in water wet pores, and extracted T2 distributions of mobile water in non-water wet pores. A wettability index (e.g., a value from −1 to +1) is calculated based on a comparison of the extracted T2 distributions.

The wettability of formation is an important factor for improving or optimizing hydrocarbon production of oil/gas reservoirs. Quantification of the wettability of rock is important, for example, because wettability has effects on capillary pressure, relative permeability, and saturation distributions of reservoirs. There are multiple properties that have influences on the wettability of rock. Such properties include rock minerals, fluid compositions, fluid viscosities, surface tension, surface roughness, pore geometries, pore connections, temperature, pressure, etc. Additionally, hydrocarbon migration history, the hydrocarbon production, and the drilling mud invasion may cause the changes of the wettability of rock.

Wettability can manifest as water wet, mixed wet or intermediate wet and oil wet. In water wet rock, the tendency for water to fill rock pores and to contact most of the rock surface is higher than the tendency for oil. In oil wet rocks, the tendency of oil to fill pores and to contact most of the rock surface is higher than the tendency for water. In a mixed wet rock, the water phase occupies smaller pores or larger water-wet pores. In larger oil and water filled pores or smaller oil-wet pores, oil wets part of the pore surfaces.

The wettability index is quantified using various extracted NMR T2 distributions of mobile water. This quantification is based on a recognition that mobile water can exist in both wetting and non-wetting phases for a mixed wet rock, and that the T2 relaxation times of water in wetting and non-wetting phase are significantly different. The wettability index (WI) of rock is defined herein based on the following equations:

$$WI_i = \frac{V_{W,w}^{NMR,i} - V_{W,nw}^{NMR,i}}{V_W^{NMR,i}}$$

$$V_W^{NMR,i} = V_{W,w}^{NMR,i} + V_{W,nw}^{NMR,i}$$

$$V_{W,w}^{NMR,i} = \sum_{j=1}^{N_{T_2}} P_{i,W_w}(T_{2,j})$$

$$V_{W,nw}^{NMR,i} = \sum_{j=1}^{N_{T_2}} P_{i,W_{nw}}(T_{2,j}),$$

where $V^{NMR,i}_W$ is a summation of the extracted T2 distribution of mobile water (based on the PCA and non-negative factorization) for the ith measurement, $V^{NMR,i}_{W,w}$ is a summation of extracted T2 distribution of mobile water in wetting phase for the ith measurement, and $V^{NMR,i}_{W,nw}$ is a summation of extracted T2 distribution of mobile water in non-wetting phase for the ith measurement. $T_{2,j}$ is the jth T2 relaxation time bin, $\{P_{i,W,w}(T_{2,j})\}$ is a T2 distribution of mobile water in the wetting phase for the ith measurement, and $\{P_{i,W,nw}(T_{2,j})\}$ denotes the T2 distribution of mobile water in the non-wetting phase for the ith measurement. The range of this wettability index is scaled from positive 1 for the strongest water-wet, through 0 for the neutral wet, to negative 1 for the strongest oil-wet.

Embodiments described herein present a number of advantages. For example, the wettability quantification embodiments provide comparable wettability values to other methods (such as the industry standard Amott-Harvey and USBM methods) but can be performed without knowledge of various formation or rock properties required by such methods. For example, the wettability quantification method described herein has no requirement for pre-knowledge of properties such as fluid composition, surface relaxivities of rock, saturation distributions of rock, reservoir temperature, reservoir temperature, pore size distributions, pore connections or others. In addition, the method described herein is robust, because it integrates a plurality of measured of T2 distributions of rocks measured under various fluid or saturation conditions. Methods described herein can also be extended to process D-T2 and T1/T2 data of shale formations.

A "fluid condition" is a condition of the saturated rock or a rock sample related to the components, phases, saturations, temperature, phase pressures, and phase behaviors of various fluids (water and oil-based fluids) or fluid combinations. The fluid condition may include a fluid saturated rock condition related to saturation (e.g., oil or water saturation) and/or fluid flow within a rock. "Rock" or "rock material" is intended to indicate any combination of geological materials that may be found in a subterranean region. "Oil" is intended to indicate any combination of one or more hydrocarbons. "Water" is intended to indicate water or a water-based solution (e.g., brine).

In an embodiment, the method includes taking NMR measurements of a rock sample (e.g., a core sample taken via a borehole) or comparable rock samples under various applied fluid conditions. Each applied fluid condition may be a fluid saturated rock condition. For each fluid condition (i.e., saturation state), NMR measurements are performed and an associated T2 distribution ("raw T2 distribution") is calculated. In an embodiment, the fluid conditions are incrementally changed, so that factors responsible for the variability among the raw T2 distributions can be identified.

For example, a fluid mixture including a water-based fluid (e.g., brine), an oil-based fluid and/or surfactant(s) is applied to a sample (e.g., through centrifuge) to achieve a first fluid saturated rock condition referred to as irreducible water saturation ("Swirr"), in which the sample pores retain no mobile water. Irreducible water saturation defines the maximum water saturation that a core or formation can retain without producing water, or the minimum water saturation if the core or formation is producing water.

The fluid saturated rock condition is modified to put the sample in various fluid saturated rock conditions. A fluid saturated rock condition or saturation state can be either a one phase saturation such as water saturation or oil saturation, or a mixed saturation, such as two phase (e.g., water and hydrocarbon) saturation or three phase (e.g., water, oil and gas) saturation. An example of a such as a residual oil saturation ("Sor") condition. Other fluid saturated rock conditions of rock include, for example, spontaneous oil imbibition ("Sor-spont") condition and forced water drainage ("Sor-forced"). An NMR measurement is performed for each condition and a raw T2 distribution is derived. The sample may also be put into a water saturated condition ("Sw"), forced ("Sw-forced") and/or spontaneous water imbibition ("Sw-spont") condition.

The following is an embodiment of a method or algorithm for estimating a wettability index based on T2 distributions inverted from NMR T2 echo trains. The method may be performed using a machine learning or artificial intelligence algorithm. The method is based on taking NMR measurements of a core sample (i.e., a single core sample or multiple core samples of rock taken from the same or similar formation) under various fluid conditions, such as the fluid saturated rock conditions discussed above.

The method includes a plurality of steps or stages. In an embodiment, the method includes the execution of all of the stages in the order described. However, certain stages may be omitted, stages may be added, or the order of the stages changed.

The method is discussed in conjunction with an example, aspects of which are shown in FIGS. 1-6. It is noted that this example is provided for illustrative purposes only and is not intended to be limiting. It is also noted that embodiments are not limited to the specific number or type of fluid saturated rock conditions discussed herein.

In a first stage, raw T2 distributions are derived (i.e., inverted from T2 echo trains) from NMR measurements taken under each of the fluid saturated rock conditions.

FIG. 1 shows an example of T2 distributions inverted from NMR T2 measurements of a water wet sample (e.g., core). In this example, a fluid brine or oil was injected into the sample to induce different fluid saturated rock conditions. The fluid saturated rock conditions in this example include Swirr, Sor-forced, Sor-spont, Sw-forced and/or Sw-spont. NMR measurements were performed and a T2 distribution was obtained for each fluid saturated rock condition. Also in this example, the core sample is a water wet core in which no surfactants were applied to the core. FIG. 1 shows raw T2 distributions as curves (graph 10) as incremental porosity (dphi) at each T2 relaxation time bin.

The following stages two through nine represent an example of analyzing raw T2 distributions and extracting T2 distributions, and stage ten represents an example of calculation of the wettability index. Stages two through nine may be considered part of stage 83 of the method 80, and stage ten may be considered part of stage 84 of the method 80.

In the second stage, a number M of raw T2 distributions $Pi(T_{2,1})$ are used as inputs to generate a measurement matrix P, as follows:

$$P = \begin{bmatrix} P_1(T_{2,1}) & P_1(T_{2,2}) & & P_1(T_{2,N_{T2}}) \\ \vdots & \vdots & & \vdots \\ P_m(T_{2,1}) & P_m(T_{2,2}) & \cdots & P_m(T_{2,N_{T2}}) \\ P_M(T_{2,1}) & P_M(T_{2,2}) & & P_M(T_{2,N_{T2}}) \end{bmatrix} = \begin{bmatrix} P_1 \\ \vdots \\ P_m \\ \vdots \\ P_M \end{bmatrix}, \quad (1)$$

where $P_m$ is the mth T2 distribution, $T_{2,j}$ denotes the jth T2 relaxation time bin, M is the total number of T2 distribution, and $N_{T2}$ is the total number of T2 relaxation time bins.

The term "bin" relates to a predefined set of relaxation times. Echo trains are inverted into T2 distributions using a Laplace transformation. Multiple pre-defined T2 bins are used in the inversion of NMR echo trains to cover the range of interest of relaxation times in order to simplify processing.

In the example of FIG. 1, there are five T2 distributions (M=5). Curve 11 represents $P_1(T_{2,j})$, which is a T2 distribution based on measurements of the sample at the irreducible water saturation, denoted as a Swirr condition. Curve 12 represents $P_2(T_{2,j})$, which is a T2 distribution based on measurements of the sample at the zero capillary pressure during a water imbibition process, denoted as a Sor-spont condition. Curve 13 represents $P_3(T_{2,j})$, which is a T2 distribution based on measurements of the sample at the forced water drainage after the residual oil condition, denoted as a Sor-forced condition. Curve 14 represents $P_4(T_{2,j})$, which is a T2 distribution based on measurements of the sample at the zero capillary pressure during its second drainage process, so-called Sw-spont condition, and curve 15 represents $P_5(T_{2,j})$, which is a T2 distribution based on measurements of the sample in the forced water injection Sw-forced condition.

In the third stage, a normalized measurement matrix X of the raw T2 distributions is calculated as follows:

$$X = \begin{bmatrix} P_1 - \mu \\ \vdots \\ P_m - \mu \\ \vdots \\ P_M - \mu \end{bmatrix} D^{-1/2}, \quad (2)$$

$$\mu = \frac{1}{M} \sum_{m=1}^{M} P_m = [\mu_1 \ \mu_2 \ \cdots \ \mu_{N_{T2}}] \quad (3)$$

$$D = \text{diag}(d_1 \ d_2 \ \cdots \ d_n \ \cdots \ d_{N_{T2}}) \quad (4)$$

$$d_n = \frac{1}{M-1} \sum_{m=1}^{M} [P_m(T_{2,n}) - \mu_n]^2$$

where D is a diagonal matrix composed of variances $d_n$, and $n=1, 2, \ldots, N_{T2}$.

An analysis is performed to identify factors having significant effects on variability. For example, a feature analysis such as Principal component analysis (PCA) is performed on the normalized measurement matrix X to identify one or more principal components, or factors that have the significant effects on the variability of the raw T2 distributions. Other examples of feature analyses include independent component analysis (ICA) and blind source ICA.

In the fourth stage, singular value decomposition is performed on the covariance matrix $X^T X$ of X:

$$X^T X = V \Sigma_V V^T \quad (5)$$

where T denotes transverse operation, V is the matrix composed of the singular vectors, and $\Sigma_V$ is a singular value matrix, which is composed of variances (singular values). The singular value matrix is represented by:

$$\Sigma_V = \begin{bmatrix} \sigma_1^2 & & & \\ & \sigma_2^2 & & \\ & & \ddots & \\ & & & \sigma_M^2 \end{bmatrix}, \quad (6)$$

$$\sigma_1^2 > \sigma_2^2 > \ldots > \sigma_M^2$$

In the fifth stage, a number r of factors are identified that account for a selected percentage of the variability in the measurement data. For example, the identified factors satisfy the following condition:

$$\sum_{m=1}^{r} \sigma_m^2 > 95\% \sum_{i=1}^{M} \sigma_i^2, \quad (7)$$

where r is the number of identified significant factors, i.e., the identified factors cause variances $\sigma_1^2 \ldots \sigma_r^2$.

In an embodiment, the two variances that satisfy the above condition are the factors associated with the fluid displacement processes. In this embodiment, if r>2, the method is stopped and a warning for the change of wettability may be output.

In the seventh stage, non-negative factorization is performed on the measurement matrix P. The matrix P is factorized into two matrices W and H, such that none of the matrices P, W and H have any negative elements.

For example, non-negative factorization of the measurement matrix P is performed using the number r of feature components as an input (e.g., 2) to minimize:

$$\min\left\{ \frac{\left\| P_{M \times N_{T_2}} - W_{M \times r} H_{r \times N_{T_2}} \right\|}{\sqrt{M N_{T_2}}} \right\} \quad (8)$$

where matrices $$W_{m \times r} = \begin{bmatrix} w_1 \\ w_2 \\ \vdots \\ w_{M-1} \\ w_M \end{bmatrix}$$

and $$H_{r \times n} = \begin{bmatrix} h_1 \\ h_2 \\ \vdots \\ h_{r-1} \\ h_r \end{bmatrix}$$

are composed of non-negative raw vectors.

Figure 2:
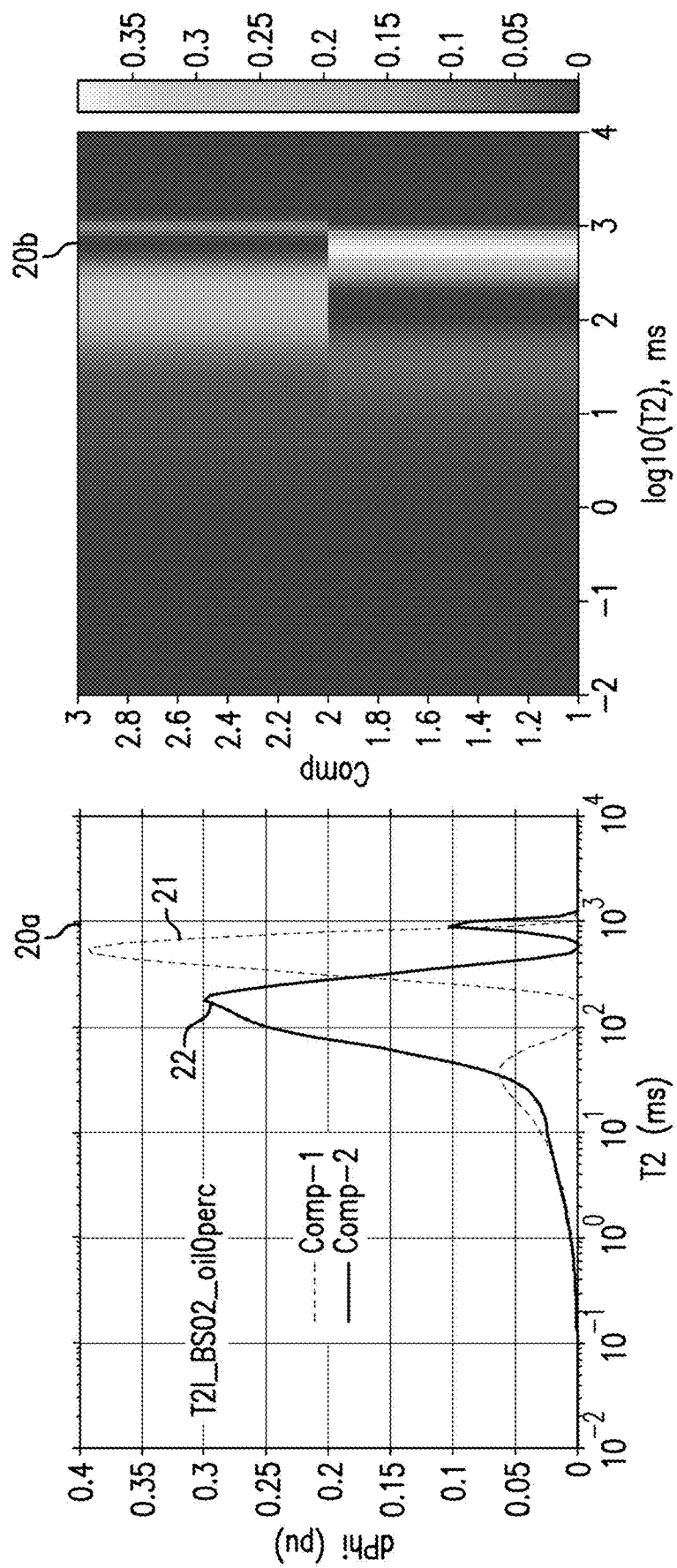
FIG. 2 depicts an example of feature components extracted using non-negative factorization of a measurement matrix constructed using the raw T2 distributions, according to an embodiment of a method of estimating a wettability characteristic.

FIG. 2 depicts an example of feature components extracted from NNMF. Graph 20a includes T2 distribution curves 21 and 22, and 20b is the image of identified feature components of T2 distributions. One of the feature components (curve 21) is associated with oil saturation and the other feature component (curve 22) is associated with water saturation. Specifically, the first identified feature component (curve 21) includes the T2 distributions of the oil phase and irreducible water. The second identified feature component (curve 22) includes the T2 distributions of mobile water in water wet pores and mobile water in oil wet pores.

In the eight stage, the raw T2 distributions are reconstructed or modeled using the feature components $h_k$, k=1, 2, ..., r of T2 distributions of rocks. In an embodiment, the modeled or reconstructed T2 distributions are derived using the following equation:

$$H_{r \times N_{T_2}}^T c_i^T = P_i^T, i = 1, 2, \ldots \quad (9)$$

A least squared error method is then performed to compute the project vector $c_i$ for the ith raw T2 distribution based on:

$$c_i^T = \left( H_{r \times N_{T_2}} H_{k \times N_{T_2}}^T \right)^{-1} H_{r \times N_{T_2}} P_i^T \quad (10)$$

Figure 3:
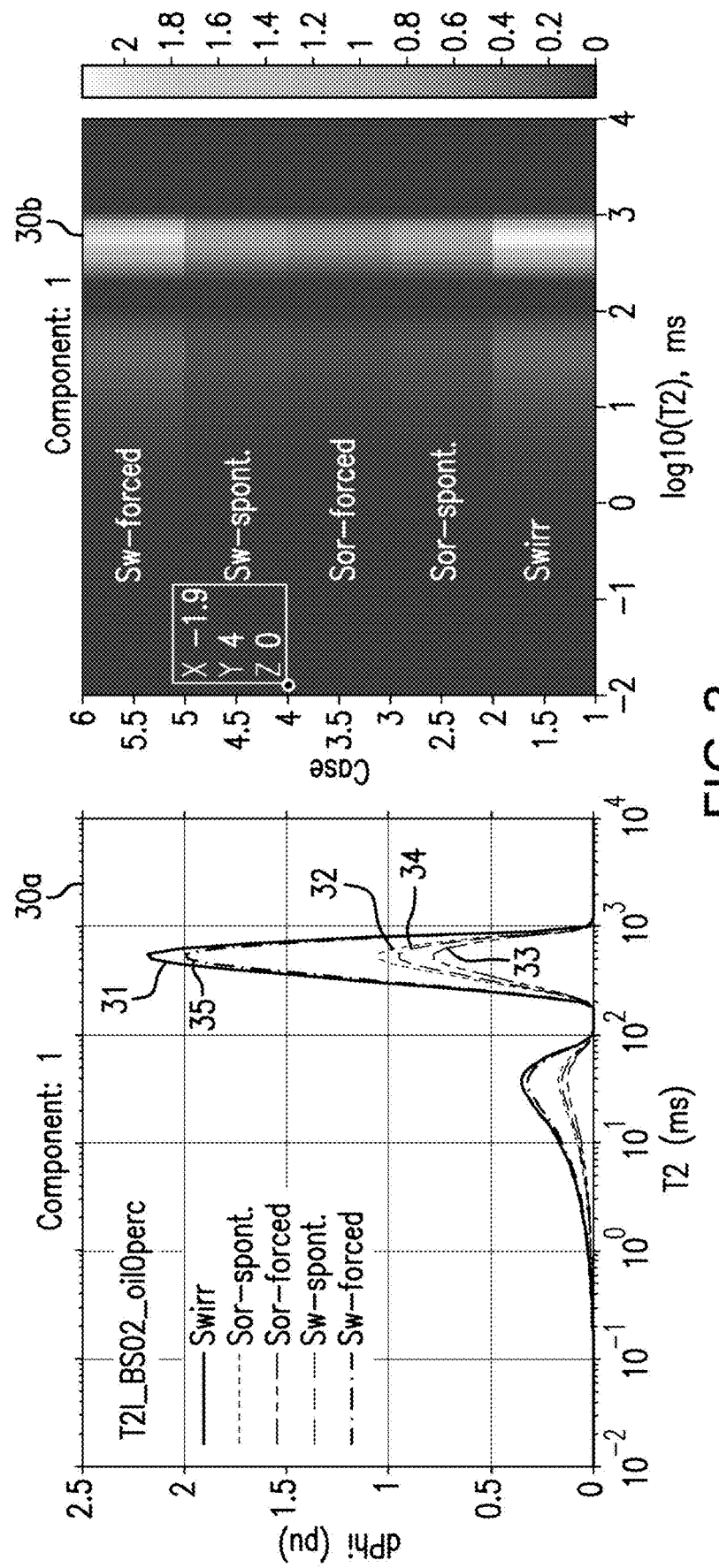
FIG. 3 depicts an example of modeled T2 distributions based on the raw T2 distributions of FIG. 1 and a first feature component of FIG. 2.
Figure 4:
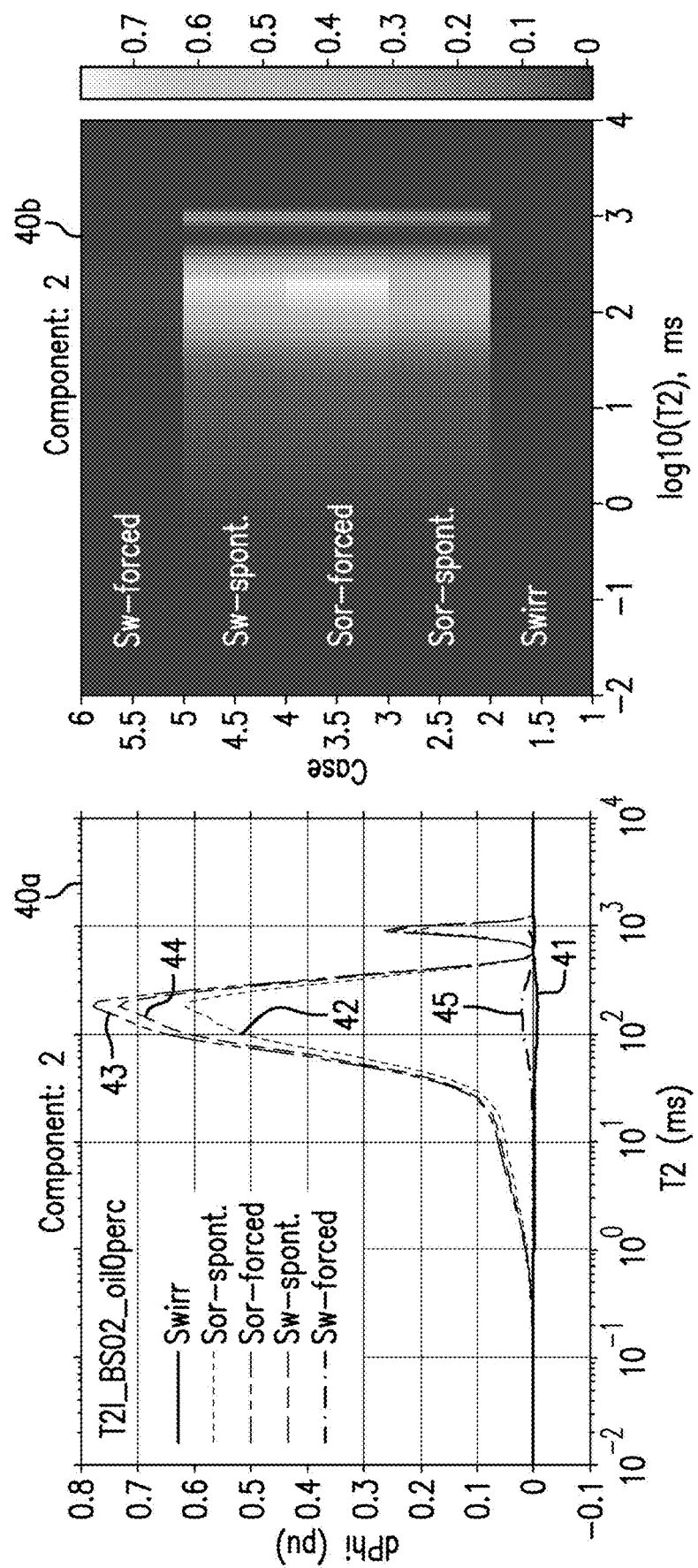
FIG. 4 depicts an example of modeled T2 distributions based on the raw T2 distributions of FIG. 1 and a second feature component of FIG. 2.

FIGS. 3 and 4 show an example of modeled T2 distributions using feature components. FIG. 3 depicts a graph 30a of five T2 distributions that were reconstructed according to the above description using the first feature component, and 30b is an image of the plots of the graph 30a.

The curves in the graph 30a of FIG. 3 are components of the raw T2 distributions that are associated with the displacement of water by oil. The graph 30a includes a modeled (or reconstructed) T2 distribution 31 based on the raw T2 distribution associated with the Swirr condition, and a modeled T2 distribution 32 based the raw T2 distribution associated with the Sor-spont condition. A modeled T2 distribution 33 is based on the raw T2 distribution associated with the Sor-forced condition, a modeled T2 distribution 34 is based the raw T2 distribution associated with the Sw-spont condition, and a modeled T2 distribution 35 based on the raw T2 associated with the Sw-forced condition.

FIG. 4 depicts a graph 40a of modeled or reconstructed T2 distributions based on the second feature component, and corresponding images 40b.

The curves in the graph 40a of FIG. 4 are components of the raw T2 distributions that are associated with the displacement of oil by water. The graph 40a includes a modeled T2 distribution 41 based on the raw T2 distribution associated with the Swirr condition, and a modeled T2 distribution 42 based the raw T2 distribution associated with the Sor-spont condition. A modeled T2 distribution 43 is based on the raw T2 distribution associated with the Sor-forced condition, a modeled T2 distribution 44 is based the raw T2 distribution associated with the Sw-spont condition, and a modeled T2 distribution 45 is based on the raw T2 distribution associated with the Sw-forced condition.

In the ninth stage, T2 distributions of fluids in different phases are extracted from the modeled T2 distributions. The T2 distributions may be extracted using any suitable technique. In an embodiment, a windowing technique is used to extract the T2 distributions. For example, the T2 distributions for different phases is extracted using the following rectangular window:

$$\hat{P}_{i,f_l} = \hat{P}_{i,j_r} \text{diag}[0 \ \ldots \ 0 \ 1 \ \ldots \ 1 \ 0 \ \ldots \ 0], \quad (11)$$

$$\hat{P}_{i,j_r} = c_{i,j_r} h_{j_r}$$

$$l = w_{irr}, o, W_{nw}, W_{w}, i = 1, 2, \ldots$$

where $w_{irr}$ is for irreducible water, o represents oil, $W_{nw}$ denotes mobile water in non-wetting phase, $W_w$ is for mobile water in wetting phase. The distributions for water in wetting phase and water in non-wetting phase are selected for use in the wettability index calculation.

Figure 5:
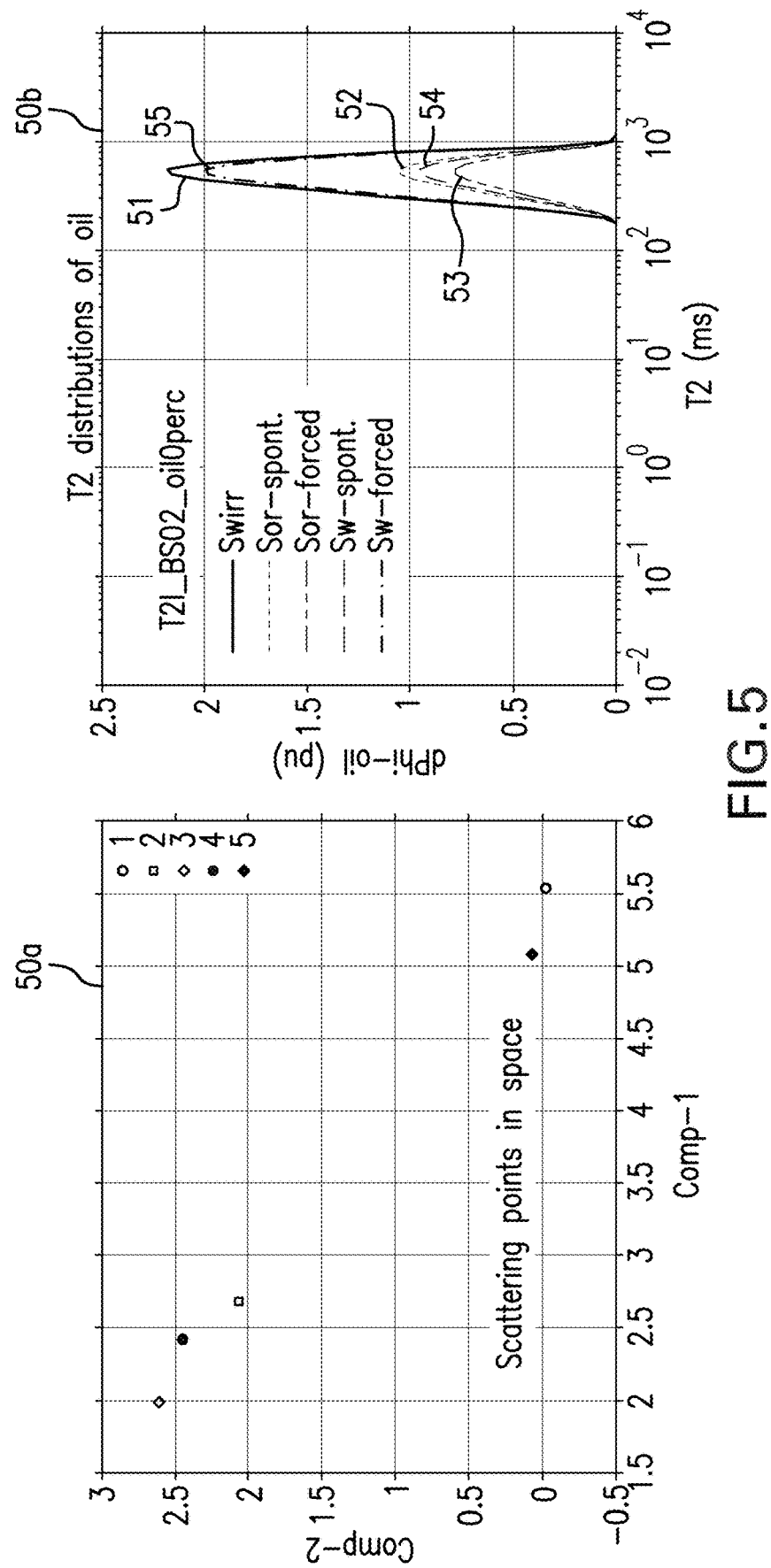
FIG. 5 depicts an example of T2 distributions of oil phase extracted from the modeled T2 distributions of FIG. 3.

FIG. 5 shows examples of mapped and extracted T2 distributions. FIG. 5 includes a plot 50a that shows the raw T2 distributions mapped to a feature space.

FIG. 5 also shows an example of T2 distributions extracted using the windowing technique, in which the extracted T2 distributions represent fluid in oil phase. An extracted T2 distribution 51 is associated with the Swirr condition, an extracted T2 distribution 52 is associated with the Sor-spont condition, and an extracted T2 distribution 53 is associated with the Sor-forced condition. Extracted T2 distributions 54 and 55 are associated with the Sw-spont condition and the Sw-forced condition, respectively.

Figure 6:
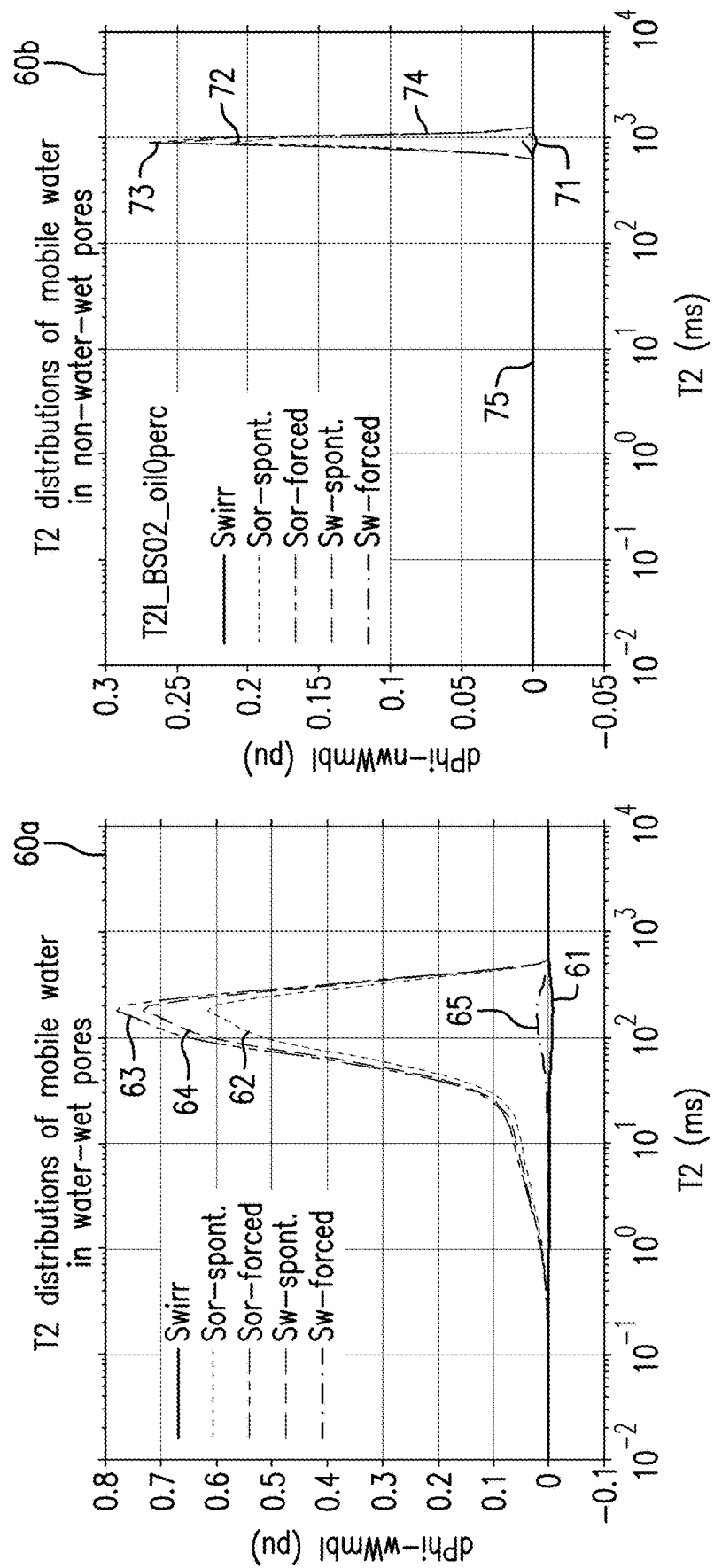
FIG. 6 depicts an example of T2 distributions of mobile water in water wet pores and non-water-wet pores extracted from the modeled T2 distributions of FIG. 4.

FIG. 6 shows examples of extracted T2 distributions of mobile water in water wet pores (graph 60a) and of mobile water in non-water wet pores (graph 60b). Extracted T2 distributions 61, 62 and 63 of mobile water in water wet pores are associated with the Swirr condition, the Sor-spont condition and the Sor-forced condition, respectively. Extracted T2 distributions 64 and 65 are associated with the Sw-spont condition and the Sw-forced condition, respectively. Extracted T2 distributions 71, 72 and 73 of mobile water in non-water wet pores are associated with the Swirr condition, the Sor-spont condition and the Sor-forced condition, respectively. Extracted T2 distributions 74 and 75 are associated with the Sw-spont condition and the Sw-forced condition, respectively.

At the tenth stage, the wettability index is calculated based on the extracted T2 distributions of mobile water in water wet and non-water wet pores (e.g., distributions of FIG. 6). For example, the T2 distributions of mobile water in wetting phase and the T2 distributions $V^{NMR}i_{W,nw}$ of mobile water in non-wetting phase are used to calculate a wettability index $WI_i$ as follows:

$$WI_i = \frac{V_{W,w}^{NMR,i} - V_{W,nw}^{NMR,i}}{V_W^{NMR,i}} \quad (12)$$

$$V_W^{NMR,i} = V_{W,w}^{NMR,i} + V_{W,nw}^{NMR,i} \quad (13)$$

$$V_{W,w}^{NMR,i} = \sum_{j=1}^{N_{T_2}} P_{i,W_w}(T_{2,j}) \quad (14)$$

-continued $$V_{W,nw}^{NMR,i} = \sum_{j=1}^{N_{T_2}} P_{i,W_{nw}}(T_{2,j})$$

Figure 7:
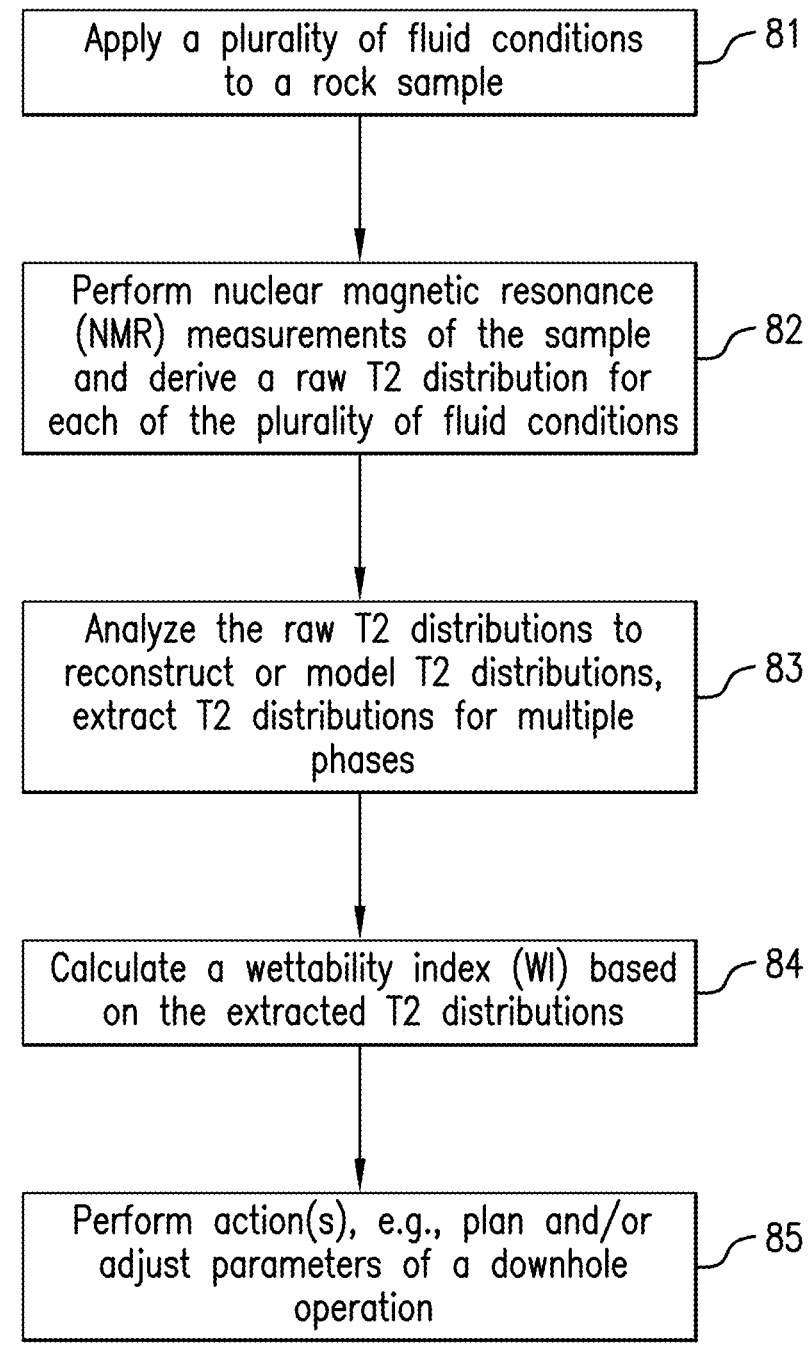
FIG. 7 is a flow diagram depicting an embodiment of a method of generating nuclear magnetic resonance measurements and estimating wettability characteristics of a rock material.

FIG. 7 illustrates a method 80 of estimating characteristics of an earth formation and/or rock sample, including wettability characteristics. The method 80 may be performed in conjunction with any measurement system. The method 80 includes one or more stages 81-85. In an embodiment, the method 80 includes the execution of all of the stages 81-85 in the order described. However, certain stages may be omitted, stages may be added, or the order of the stages changed.

At least part of the method 80 is performed on a sample of a subterranean region, such as a sample of sandstone or other porous rock. The sample is disposed in a testing system located in a laboratory or other surface location. The sample may be a core sample (or simply "core") acquired by extracting the core sample via a borehole. The sample may be initially cleaned and dried to remove any fluids.

In the first stage 81, the sample is processed by applying various fluids to the sample, to achieve various fluid conditions, such as various fluid saturated rock conditions (e.g., saturation state) of the sample. Fluid saturated rock conditions can be achieved by subjecting the sample to fluids using parameters such as pressure, temperature, fluid type, fluid flow rate and others. Fluid displacement can be achieved, for example, by centrifuge or core flooding.

For example, fluid is applied to the sample to put the sample in a number of fluid saturated rock conditions, such as Swirr, Sor-spont, Sor-forced, Sw-spont and/or Sw-forced.

In the second stage 82, NMR measurements are performed on the sample under each of the fluid saturated rock conditions, and a raw T2 distribution for each condition is derived.

In the third stage 83, the raw T2 distributions are used to form a measurement matrix, and T2 distributions are reconstructed based on PCA and non-negative factorization as discussed above. T2 distributions of mobile water in water wet pores and mobile water in non-water wet pores are extracted from the reconstructed distributions, for example, based on all or some of the stages of the method discussed above in conjunction with equations (1)-(11).

In the fourth stage 84, a wettability index (WI) is calculated based on a normalized difference between the extracted T2 distributions of mobile water in water wet pores and the extracted T2 distributions of mobile water in non-water wet pores. In an embodiment, the wettability index is calculated according to equations (12)-(14)

In the fifth stage 85, in an embodiment, various actions are performed using the wettability index and/or other data related to the sample. For example, the wettability index may be applied to downhole or surface NMR measurements of a subterranean region. The wettability index may be used planning a downhole operation and/or adjusting an operational parameter of the downhole operation based on downhole NMR measurements.

In one embodiment, the wettability index and other characteristics of the sample are integrated into a reservoir model. For example, a reservoir model of grain size, lithology and/or fluid types and volumes can be generated using the wettability characteristics, as well as any other characteristics (e.g., permeability, porosity, saturations, fluid composition) derived from NMR and/or other data. Additional data can be incorporated in the model from various sources, such as logging data, core data, fluid sample data, core flood experiment data, temperature data, pressure data, and others.

One example of a reservoir model is generated using wettability characteristics to estimate the saturation of fluids in the reservoir, which provides an estimate of the relative volumes of fluids (e.g., oil and water), as well as their distribution. The model can also be used to identify the location and extent of transition zones. An exemplary model incorporates wettability, chemical composition and surface interfacial tension characteristics.

The wettability estimation methods can be used to evaluate the effect on wettability of using various combinations of fluids, including different types of surfactants. For example, the method can be repeated applied for cores having different amounts and/or types of surfactants, to alter the wettability of a core and evaluate changes in wettability and fluid characteristics as a function of surfactants.

For example, the fluid used to estimate wettability in the example of FIGS. 1-7) was a combination of oil-based and water based fluid without any surfactant, applied to a sandstone core. Wettability indices may be calculated using fluid with various levels and/or types of surfactants, for example, to evaluate the effectiveness of such surfactants on the changes of wettability of the core sample.

FIGS. 8-13 illustrate another example and show effects on wettability of applying a fluid with surfactant. In this example, oil and water were applied to achieve the various fluid saturated rock conditions. The applied fluids were similar to those of FIGS. 1-6, except that a surfactant was included at a concentration of one percent.

Figure 8:
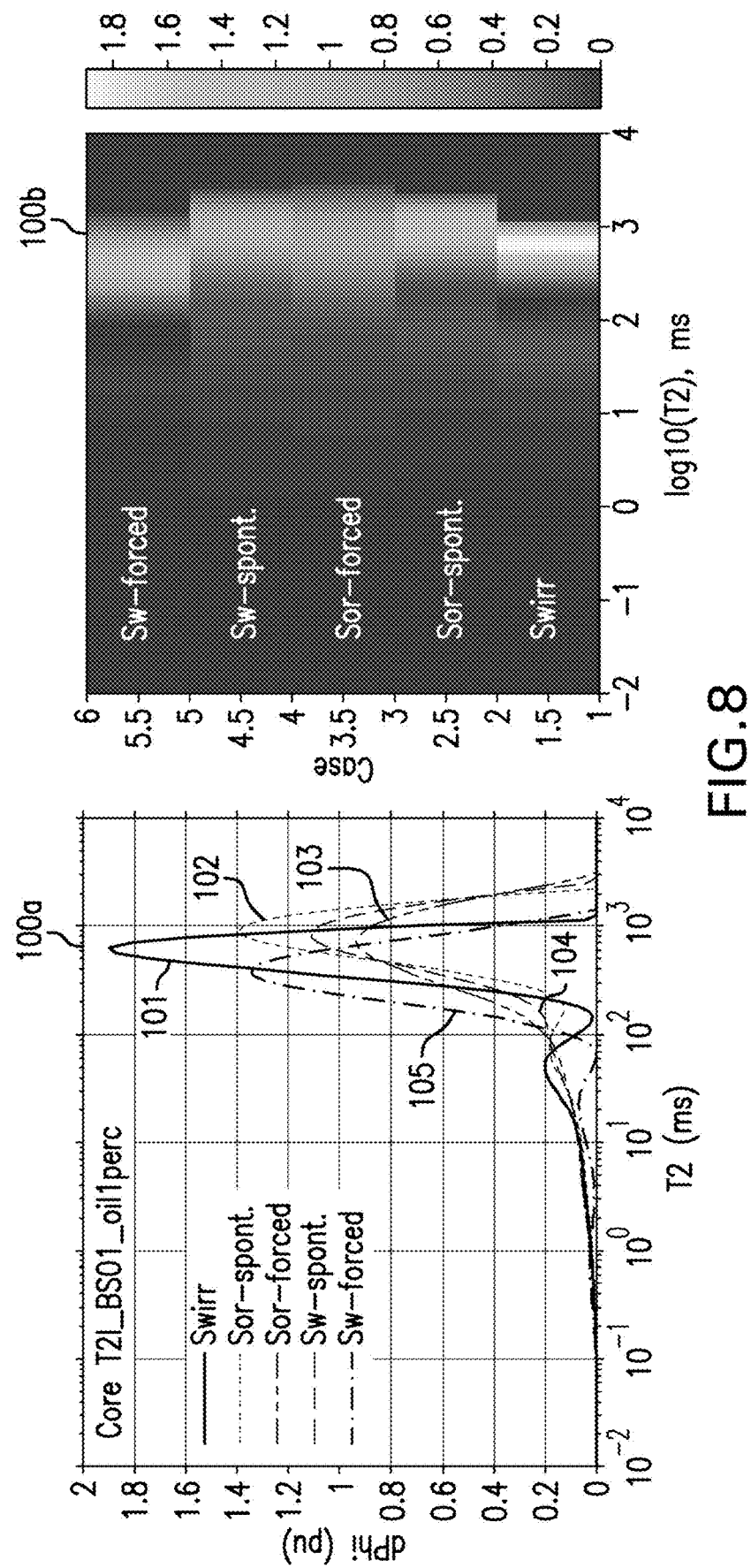
FIG. 8 depicts an example of raw T2 distributions derived from NMR measurements of a rock sample under a plurality of fluid conditions.

FIG. 8 shows a graph 100a and corresponding distribution image 100b. The graph 100a includes raw T2 distributions as curves 101-105.

Curve 101 is a raw T2 distribution based on measurements of the sample in the Swirr condition. Curve 102 is a raw T2 distribution based on measurements of the sample in the Sor-spont condition, and curve 103 is a raw T2 distribution based on measurements of the sample in the Sor-forced condition. Curve 104 is a raw T2 distribution based on measurements of the sample in the Sw-spont condition, and curve 105 is a raw T2 distribution based on measurements of the sample in the Sw-forced condition.

Figure 9:
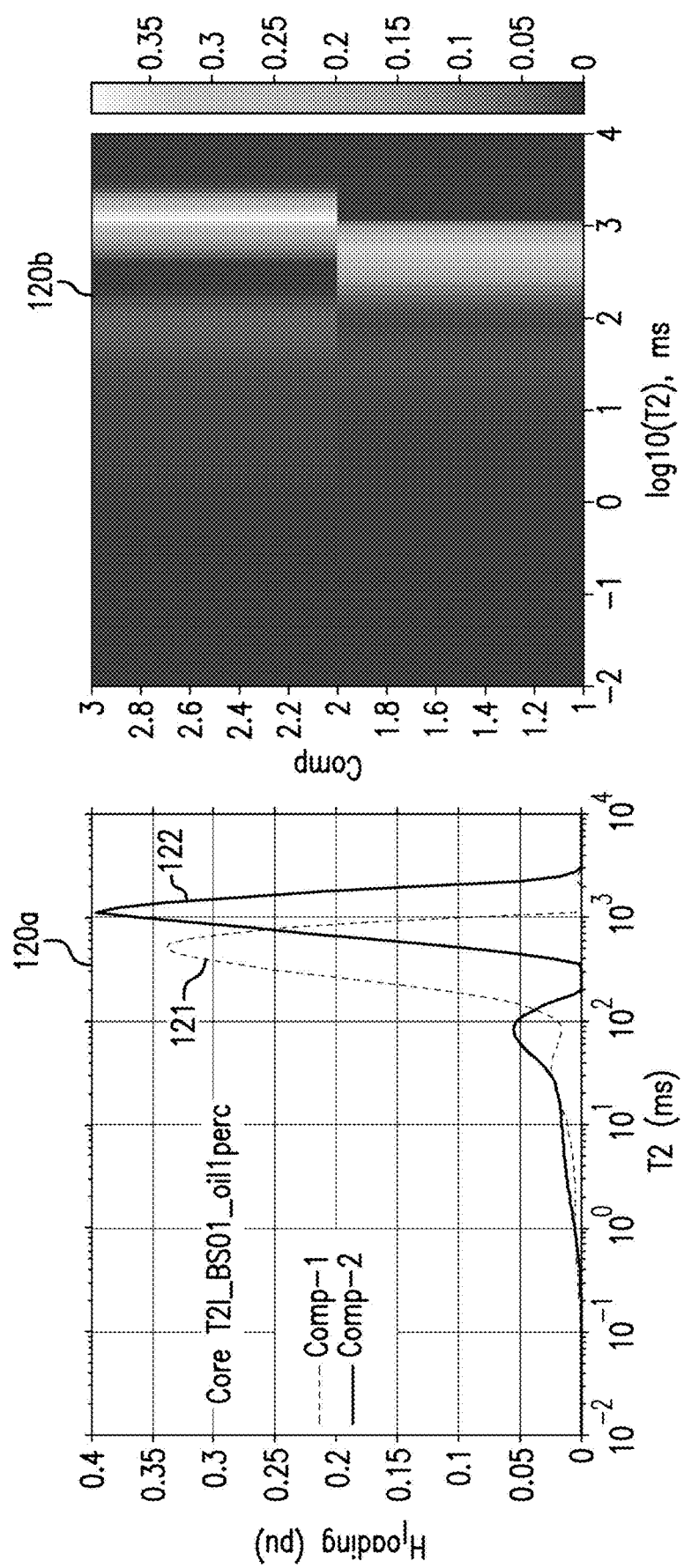
FIG. 9 depicts an example of feature components of the raw T2 distributions of FIG. 8, calculated according to an embodiment of a method of estimating a wettability characteristic.

FIG. 9 depicts an example of feature components identified as discussed above. Graph 120a includes feature components represented by T2 distribution curves 121 and 122, and 120b is a distribution image. As noted above, curve 121 includes the T2 distributions of the oil phase and irreducible water, and curve 122 includes the T2 distributions of mobile water in water wet pores and mobile water in oil wet pores.

Figure 10:
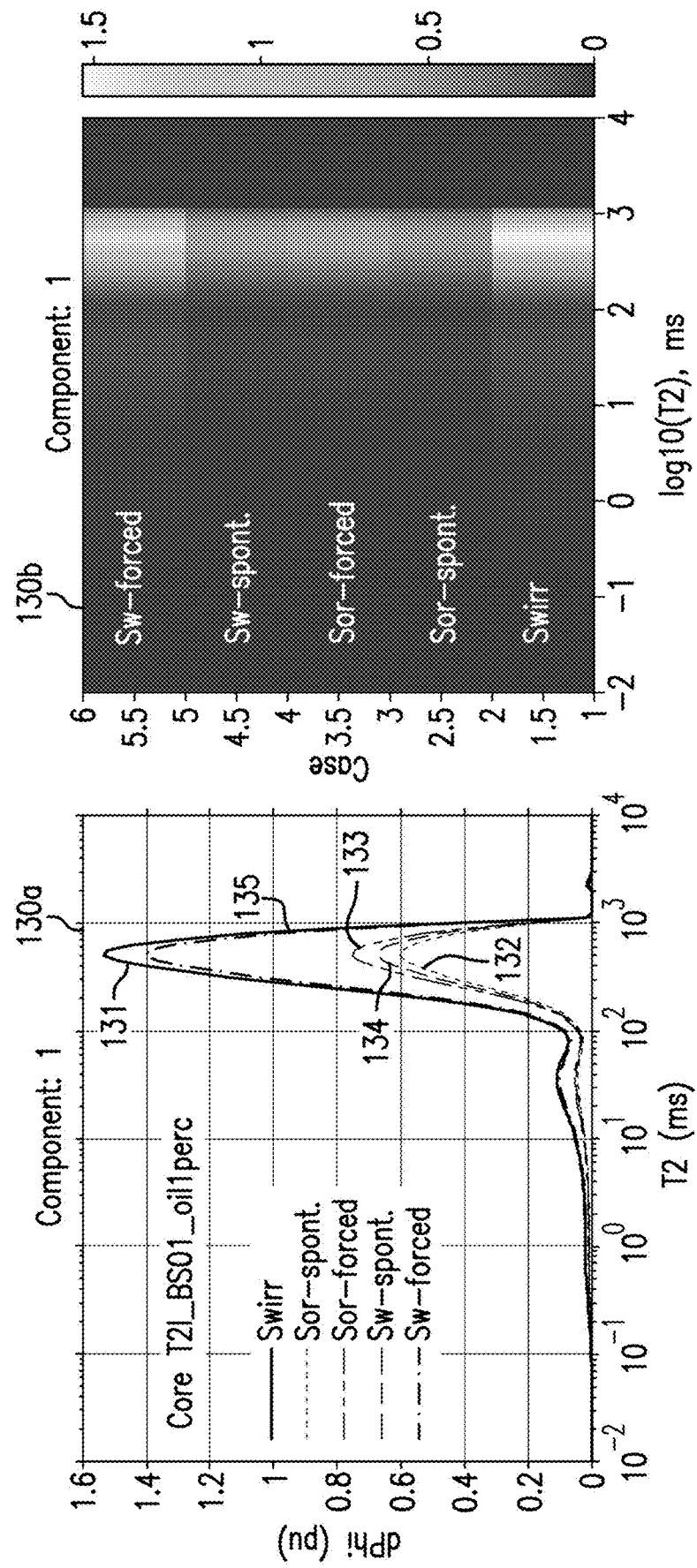
FIG. 10 depicts an example of modeled T2 distributions based on the raw T2 distributions of FIG. 8 and a first feature component of FIG. 9.
Figure 11:
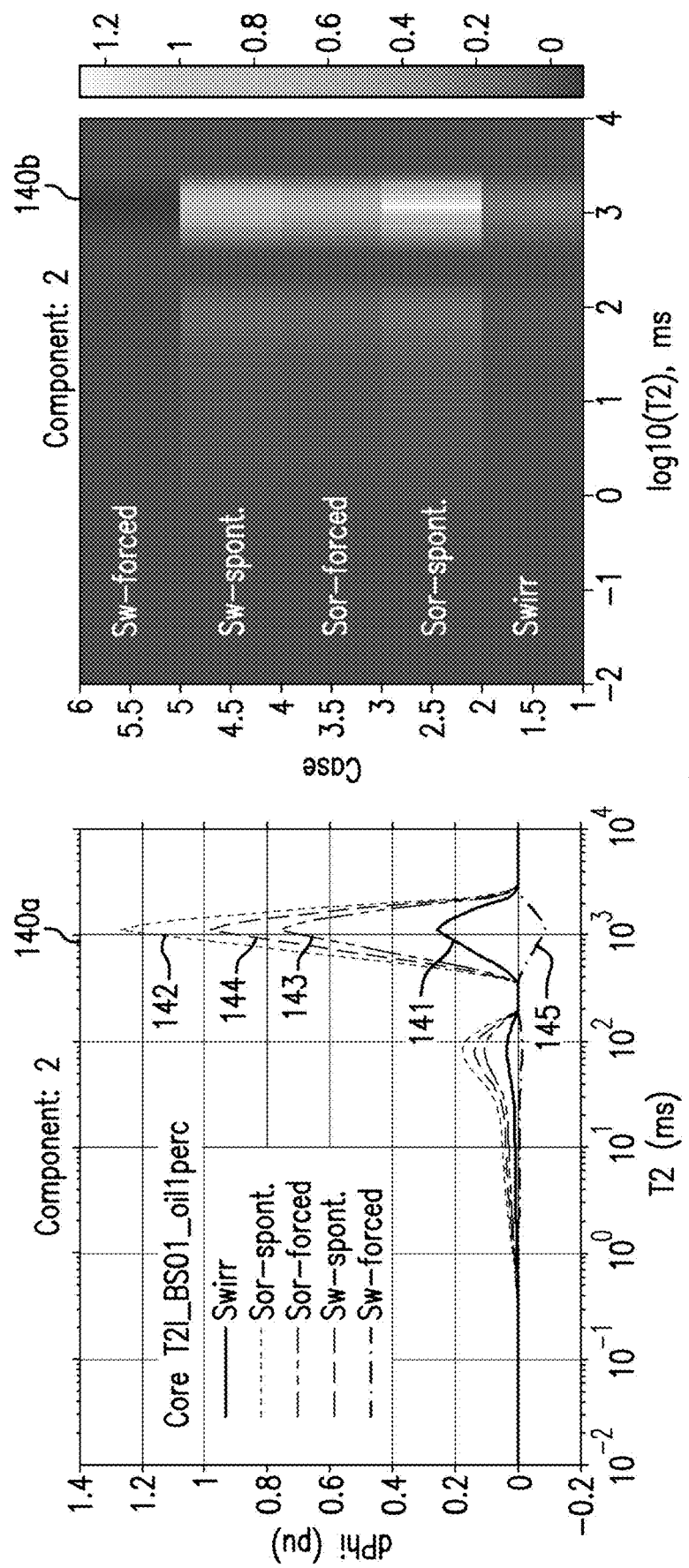
FIG. 11 depicts an example of modeled T2 distributions based on the raw T2 distributions of FIG. 8 and a second feature component of FIG. 9.

FIGS. 10 and 11 show T2 distributions modeled using the feature components. FIG. 10 depicts a graph 130a of five T2 distributions that were reconstructed using the first feature component, and corresponding distribution image 130b.

The graph 130a of FIG. 10 represents reconstructed T2 distributions using the first feature component. The graph 130a includes a modeled T2 distribution 131 based on the raw T2 distribution associated with the Swirr condition, and a modeled T2 distribution 132 based the raw T2 distribution associated with the Sor-spont condition. A modeled T2 distribution 133 is based on the raw T2 associated with the Sor-forced condition, a modeled T2 distribution 134 is based the raw T2 associated with the Sw-spont condition, and a modeled T2 distribution 135 based on the raw T2 associated with the Sw-forced condition.

FIG. 11 depicts a graph 140a of reconstructed T2 distributions based on the second feature component, and corresponding distribution image 140b.

The graph 140a includes a modeled T2 distribution 141 based on the raw T2 associated with the Swirr condition, and a modeled T2 distribution 142 based the raw T2 associated with the Sor-spont condition. A modeled T2 distribution 143 is based on the raw T2 associated with the Sor-forced condition, a modeled T2 distribution 144 is based the raw T2 associated with the Sw-spont condition, and a modeled T2 distribution 145 is based on the raw T2 associated with the Sw-forced condition.

Figure 12:
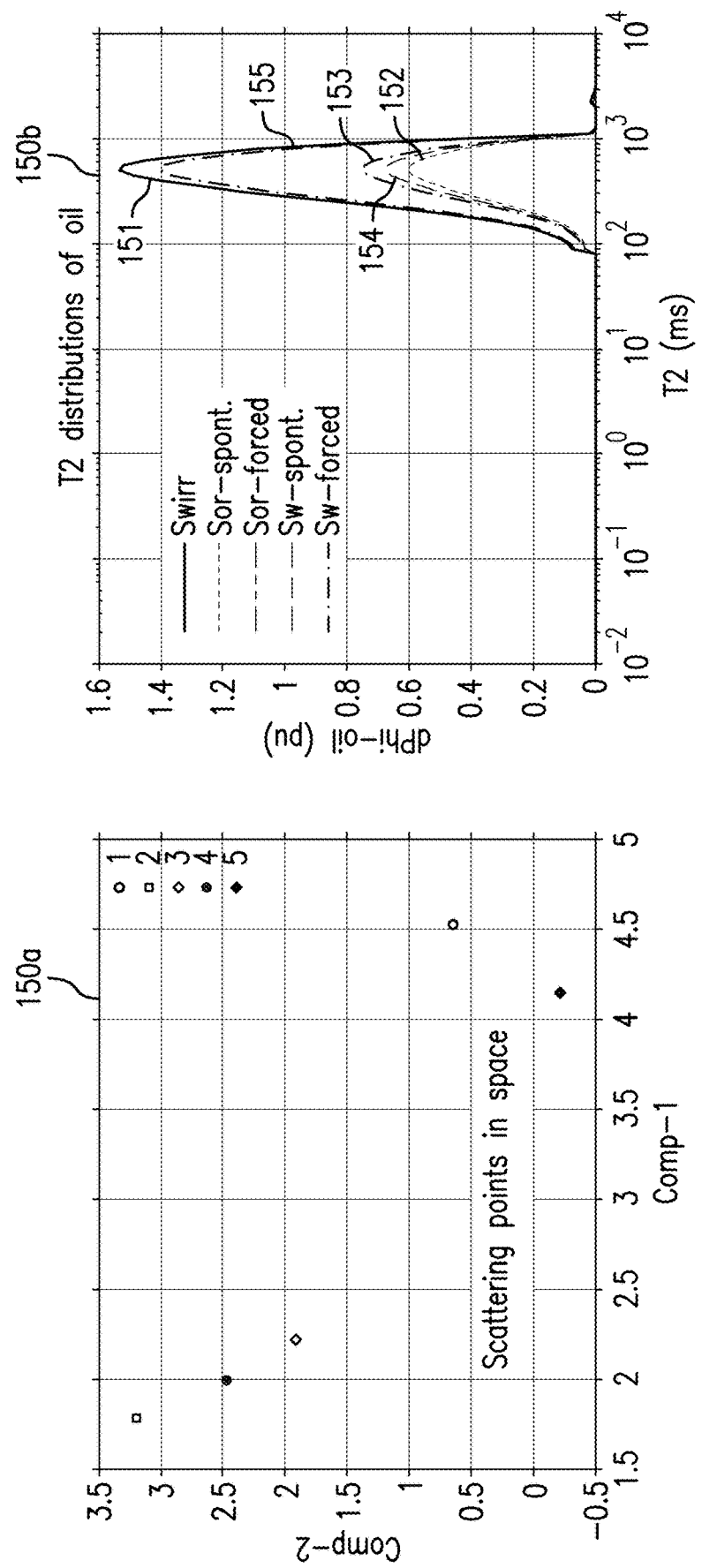
FIG. 12 depicts an example of T2 distributions of oil phase extracted from the modeled T2 distributions of FIG. 10.

FIG. 12 shows mapped T2 distributions and T2 distributions extracted using the windowing technique, in which the T2 distributions are associated with the oil. Graph 150a shows raw distribution curves mapped into the feature space and graph 150b shows T2 distributions of oil. An extracted T2 distribution 151 is associated with the Swirr condition, an extracted T2 distribution 152 is associated with the Sor-spont condition, and an extracted T2 distribution 153 is associated with the Sor-forced condition. Extracted T2 distributions 154 and 155 are associated with the Sw-spont condition and the Sw-forced condition, respectively.

Figure 13:
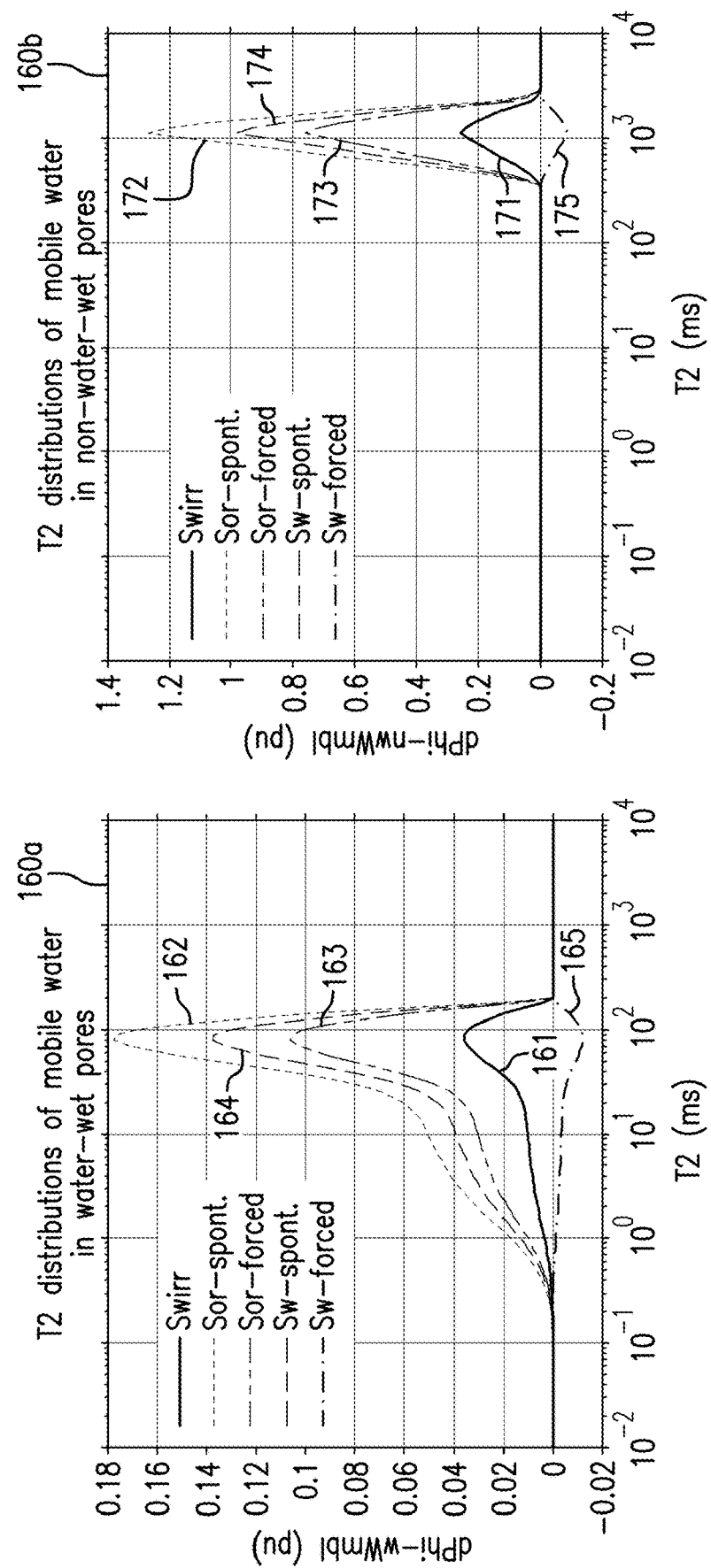
FIG. 13 depicts an example of T2 distributions of mobile water in water wet pores and non-water-wet pores extracted from the modeled T2 distributions of FIG. 11.

FIG. 13 shows examples of extracted T2 distributions of mobile water in water wet pores (graph 160a) and of mobile water in non-water wet pores (graph 160b). Extracted T2 distributions 161, 162 and 163 of mobile water in water wet pores are associated with the Swirr condition, the Sor-spont condition and the Sor-forced condition, respectively. Extracted T2 distributions 164 and 165 are associated with the Sw-spont condition and the Sw-forced condition, respectively. Extracted T2 distributions 171, 172 and 173 of mobile water in non-water wet pores are associated with the Swirr condition, the Sor-spont condition and the Sor-forced condition, respectively. Extracted T2 distributions 174 and 175 are associated with the Sw-spont condition and the Sw-forced condition, respectively.

In the example of FIGS. 1-6, the wettability index was calculated as 0.9006, indicating a strong preference for water wetting. In comparison, the wettability index calculated for the example of FIGS. 8-13 was −0.5272, indicating a preference for oil wetting.

Figure 14:
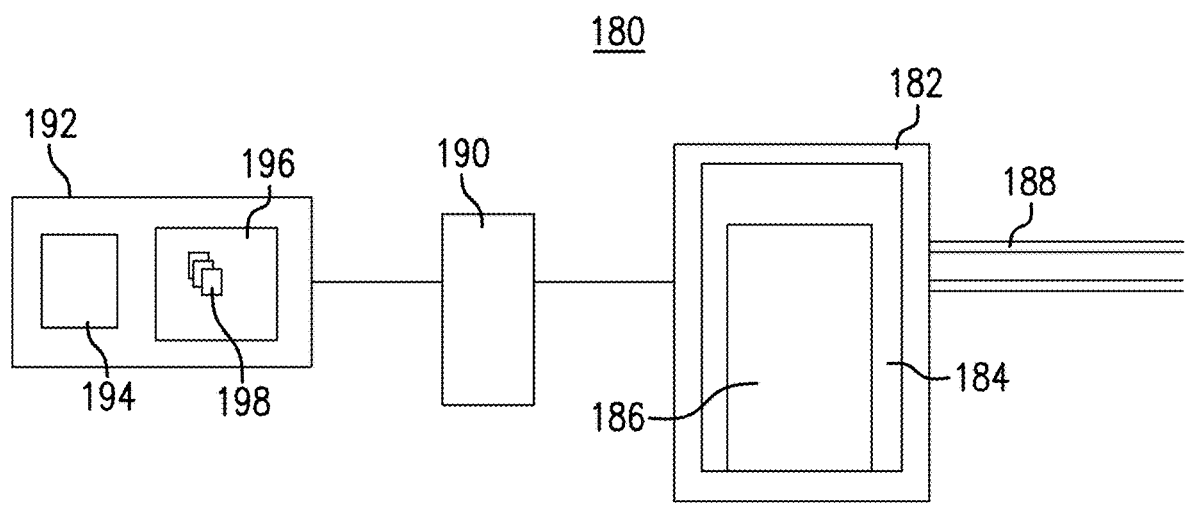
FIG. 14 depicts an example of a testing and analysis system configured to perform one or more aspects of the method of FIG. 7.

FIG. 14 depicts an example of a core analysis system 180 that may be used to apply the methods described herein. The core analysis system 180 includes a core holder assembly 182 having a holding chamber 184. The holding chamber 184 is configured to hold a core sample 186 and is used to apply various conditions to the core sample 186. Examples of such conditions include temperature, pressure and type of fluid applied to the core sample. One or more fluid lines 188 connect to fluid sources and allow various fluids (e.g., brine, oil-based fluids and others) to be injected into the holding chamber at controlled temperature, pressure and/or flow rates.

The core analysis system also includes an NMR measurement device 190 coupled to the holding chamber 184 for applying static magnetic fields and pulsed magnetic fields to the core sample 186, and for measuring core response. An analysis unit 192, which may be any type of processing device or system, is configured to receive measurement signals and perform the various analyses and methods described herein. The analysis unit 192 may also control aspects of fluid injection and control of conditions applied to the core sample 186. The analysis unit 192 includes a processor 194 and a memory 196 that stores one or more processing modules or programs 198 for processing NMR measurement data. The analysis unit 192 may also be configured to provide experimental results and other data to a user and/or other device. For example, the data can be transmitted to an operator or control device for purposes of planning stimulation or other operations and/or controlling operational parameters of such operations.

Figure 15:
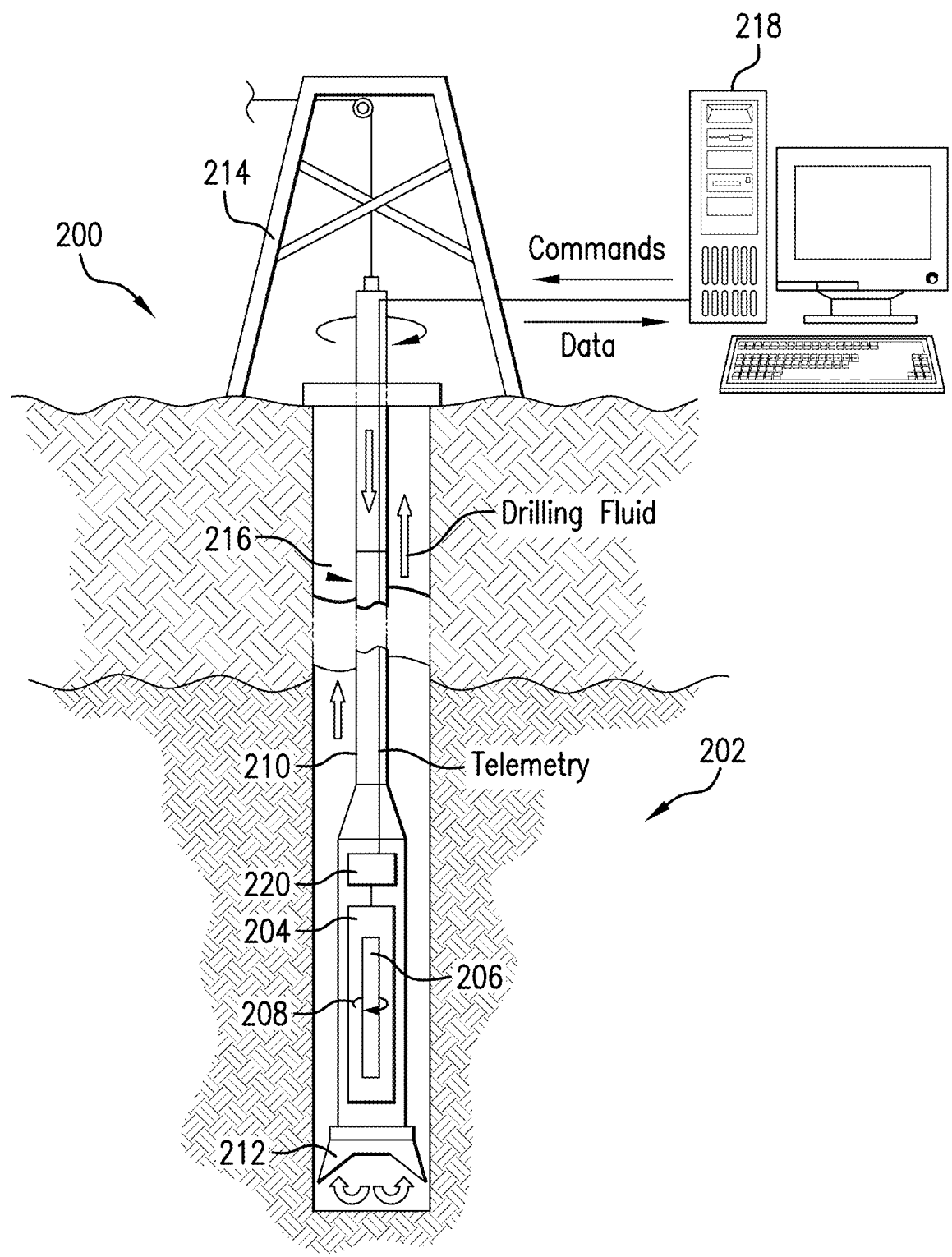
FIG. 15 depicts an example of a system for performing downhole operations.

FIG. 15 illustrates an example of a system 200 for performing energy industry operations, which can incorporate NMR tools and processing devices for performing aspects of embodiments described herein. The system 200, in this example, is a drilling and measurement system. The system 200 is not so limited, and may be configured to perform any energy industry operation, such as a stimulation, measurement and/or production operation, or any other operation related to exploration and/or recovery of resources such as oil and gas.

The system 200 includes devices or systems for in-situ measurement of characteristics of a subterranean region, such as an earth formation 202. The system 200 includes a measurement apparatus such as a measurement tool 204 configured to perform NMR measurements. In this embodiment, the measurement tool 204 is part of a logging-while-drilling (LWD) sub or assembly, but is not so limited.

An exemplary tool 204 includes a magnetic field source 206, such as one or more permanent magnets or ferrites, and an antenna 208 for transmitting and/or receiving electromagnetic signals. A single antenna 208 may be used as a transceiver for both transmitting and receiving signals, or there may be separate transmit and receive antennas 208.

The tool 204 may be configured as a component of various subterranean systems, such as wireline well logging and LWD systems. For example, the tool 204 can be incorporated within a drill string 120 including a drill bit 212 or other suitable carrier and deployed downhole, e.g., from a drilling rig 214 into a borehole 216 during a drilling operation. The tool 204 is not limited to the embodiments described herein, and may be deployed in conjunction with any downhole component or string component, such as casing pipe, wireline, wireline sondes, downhole subs and bottom-hole assemblies (BHAs).

In one embodiment, the tool 204 and/or other downhole components are equipped with transmission equipment to communicate ultimately to a surface processing unit 218. Such transmission equipment may take any desired form, and different transmission media and methods may be used, such as wired, fiber optic, and/or wireless transmission methods. Additional processing units may be deployed with the drill string 210 and/or the LWD system. For example, a downhole electronics unit 220 includes various electronic components to facilitate receiving signals and collect data, controlling antennas, effecting impedance control, transmitting data and commands, and/or processing data downhole. The surface processing unit 218, electronics 220, the tool 204, and/or other components of the system 200 include devices as necessary to provide for storing and/or processing data collected from the tool 204 and other components of the system 200. In addition, the surface processing unit may perform aspects of measurements and analyses discussed herein. Exemplary devices include, without limitation, at least one processor, storage, memory, input devices, output devices, and the like.

Set forth below are some embodiments of the foregoing disclosure:

Embodiment 1: A method of estimating a wettability characteristic of a rock material, comprising: acquiring a plurality of T2 distributions based on nuclear magnetic resonance (NMR) measurements of a rock material under a plurality of fluid saturated rock conditions; constructing a measurement matrix based on the plurality of T2 distributions; performing non-negative factorization of the measurement matrix to determine feature components; reconstructing the plurality of T2 distributions based on the feature components, and extracting a first set of T2 distributions associated with mobile water under a wetting condition and a second set of T2 distributions associated with mobile water under a non-wetting condition based on the feature components; and calculating a wettability index (WI) based on the first extracted set of T2 distributions and the second extracted set of T2 distributions.

Embodiment 2: The method of any prior embodiment, wherein calculating the wettability index includes calculating a summation of the first set of extracted T2 distributions and a summation of the second set of extracted T2 distributions, and calculating a normalized difference between the summation of the first set of extracted T2 distributions and the summation of the second set of extracted T2 distributions.

Embodiment 3: The method of any prior embodiment, wherein the wettability index is calculated according to the following equations:

$$NWI_i = \frac{V_{W,w}^{NMR,i} - V_{W,nw}^{NMR,i}}{V_W^{NMR,i}}$$

$$V_W^{NMR,i} = V_{W,w}^{NMR,i} + V_{W,nw}^{NMR,i}$$

$$V_{W,w}^{NMR,i} = \sum_{j=1}^{N_{T_2}} P_{i,W_w}(T_{2,j})$$

$$V_{W,nw}^{NMR,i} = \sum_{j=1}^{N_{T_2}} P_{i,W_{nw}}(T_{2,j}),$$

where $T_{2,j}$ is an jth T2 relaxation time bin, $\{P_{i,W,w}(T_{2,j})\}$ is a T2 distribution of the mobile water in the wetting phase for the ith measurement, and $\{P_{i,W,nw}(T_{2,j})\}$ is a T2 distribution of the mobile water in the non-wetting phase for the ith measurement.

Embodiment 4: The method of any prior embodiment, wherein the plurality of fluid saturated rock conditions are achieved by applying fluids having a plurality of fluid constituents selected from at least one of an oil-based fluid, a water-based fluid and a surfactant.

Embodiment 5: The method of any prior embodiment, wherein the extracting includes performing a feature analysis on the plurality of T2 distributions to determine a numerical value corresponding to a number of factors related to variability of the plurality of T2 distributions.

Embodiment 6: The method of any prior embodiment, wherein the extracting includes determining feature components of the measurement matrix, including a first feature component corresponding to oil displacing water, and a second feature component corresponding to water displacing oil.

Embodiment 7: The method of any prior embodiment, wherein the plurality of T2 distributions are reconstructed using the first and second feature components.

Embodiment 8: The method of any prior embodiment, wherein the numerical value is used as an input to the non-negative factorization.

Embodiment 9: The method of any prior embodiment, wherein the feature analysis method includes a principal component analysis (PCA), and the number of factors corresponds to a number of principal components.

Embodiment 10: The method of any prior embodiment, further comprising applying the wettability index to downhole or surface NMR measurements of a subterranean region.

Embodiment 11: The method of any prior embodiment, further comprising performing at least one of planning a downhole operation and adjusting an operational parameter of the downhole operation based on the downhole measurements.

Embodiment 12: A system for estimating a wettability characteristic of a rock material, the system comprising: a nuclear magnetic resonance (NMR) device configured to perform NMR measurements of a rock material; and a processor configured to perform a method including: acquiring a plurality of T2 distributions based on the NMR measurements of the rock material under a plurality of fluid saturated rock conditions; constructing a measurement matrix based on the plurality of T2 distributions; performing non-negative factorization of the measurement matrix to determine feature components; reconstructing the plurality of T2 distributions based on the feature components, and extracting a first set of T2 distributions associated with mobile water in a wetting condition and a second set of T2 distributions associated with mobile water in a non-wetting condition; and calculating a wettability index (WI) based on the first extracted set of T2 distributions and the second extracted set of T2 distributions.

Embodiment 13: The system of any prior embodiment, wherein calculating the wettability index includes calculating a summation of the first set of extracted T2 distributions and a summation of the second set of extracted T2 distributions, and calculating a normalized difference between the summation of the first set of extracted T2 distributions and the summation of the second set of extracted T2 distributions.

Embodiment 14: The system of any prior embodiment, wherein the wettability index is calculated according to the following equations:

$$NWI_i = \frac{V_{W,w}^{NMR,i} - V_{W,nw}^{NMR,i}}{V_W^{NMR,i}}$$

$$V_W^{NMR,i} = V_{W,w}^{NMR,i} + V_{W,nw}^{NMR,i}$$

$$V_{W,w}^{NMR,i} = \sum_{j=1}^{N_{T_2}} P_{i,W_w}(T_{2,j})$$

$$V_{W,nw}^{NMR,i} = \sum_{j=1}^{N_{T_2}} P_{i,W_{nw}}(T_{2,j}),$$

where $T_{2,j}$ is an jth T2 relaxation time bin, $\{P_{i,W,w}(T_{2,j})\}$ is the T2 distribution of the mobile water in the wetting phase for the ith measurement, and $\{P_{i,W,nw}(T_{2,j})\}$ is the T2 distribution of the mobile water in the non-wetting phase for the ith measurement.

Embodiment 15: The system of any prior embodiment, wherein the plurality of fluid saturated rock conditions are achieved by applying fluids having a plurality of fluid constituents selected from at least one of an oil-based fluid, a water-based fluid and a surfactant.

Embodiment 16: The system of any prior embodiment, wherein the extracting includes performing a feature analysis on the plurality of T2 distributions to determine a numerical value corresponding to a number of factors related to variability of the plurality of T2 distributions.

Embodiment 17: The system of any prior embodiment, wherein the extracting includes determining feature components of the measurement matrix, including a first feature component corresponding to oil displacing water, and a second principal component corresponding to water displacing oil Embodiment 18: The system of any prior embodiment, wherein the plurality of T2 distributions are reconstructed using the first and second feature components.

Embodiment 19: The system of any prior embodiment, wherein the numerical value is used as an input to the non-negative factorization.

Embodiment 20: The system of any prior embodiment, wherein the feature analysis includes a principal component analysis (PCA), and the number of factors corresponds to a number of principal components.

In connection with the teachings herein, various analyses and/or analytical components may be used, including digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

One skilled in the art will recognize that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The terms "about", "substantially" and "generally" are intended to include the degree of error associated with measurement of the particular quantity based upon the equipment available at the time of filing the application. For example, "about" and/or "substantially" and/or "generally" can include a range of ±8% or 5%, or 2% of a given value.

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention.

What is claimed is:

1. A method of estimating a wettability characteristic of a rock material, comprising:
    acquiring a plurality of T2 distributions based on nuclear magnetic resonance (NMR) measurements of the rock material under a plurality of fluid saturated rock conditions,
    constructing a measurement matrix based on the plurality of T2 distributions;
    performing non-negative factorization of the measurement matrix to determine feature components;
    reconstructing the plurality of T2 distributions based on the feature components, and extracting a first set of T2 distributions associated with mobile water under a wetting condition and a second set of T2 distributions associated with mobile water under a non-wetting condition based on the feature components; and
    calculating a wettability index (WI) based on the first extracted set of T2 distributions and the second extracted set of T2 distributions.

2. The method of claim 1, wherein calculating the wettability index includes calculating a summation of the first set of extracted T2 distributions and a summation of the second set of extracted T2 distributions, and calculating a normalized difference between the summation of the first set of extracted T2 distributions and the summation of the second set of extracted T2 distributions.

3. The method of claim 2, wherein the wettability index is calculated according to the following equations:

$$NWI_i = \frac{V_{W,w}^{NMR,i} - V_{W,nw}^{NMR,i}}{V_W^{NMR,i}}$$

$$V_W^{NMR,i} = V_{W,w}^{NMR,i} + V_{W,nw}^{NMR,i}$$

$$V_{W,w}^{NMR,i} = \sum_{j=1}^{N_{T_2}} P_{i,W_w}(T_{2,j})$$

$$V_{W,nw}^{NMR,i} = \sum_{j=1}^{N_{T_2}} P_{i,W_{nw}}(T_{2,j}),$$

where i is the index of measurement, $T_{2,j}$ is an jth T2 relaxation time bin, $\{P_{i,W_w}(T_{2,j})\}$ is a T2 distribution of the mobile water in the wetting phase for the ith measurement, and $\{P_{i,W_{nw}}(T_{2,j})\}$ is a T2 distribution of the mobile water in the non-wetting phase for the ith measurement.

4. The method of claim 1, wherein the plurality of fluid saturated rock conditions are achieved by applying fluids having a plurality of fluid constituents selected from at least one of an oil-based fluid, a water-based fluid and a surfactant.

5. The method of claim 1, wherein the extracting includes performing a feature analysis on the plurality of T2 distributions to determine a numerical value corresponding to a number of factors related to variability of the plurality of T2 distributions.

6. The method of claim 1, wherein the extracting includes determining the feature components of the measurement matrix, including a first feature component corresponding to oil displacing water, and a second feature component corresponding to water displacing oil.

7. The method of claim 6, wherein the plurality of T2 distributions are reconstructed using the first and second feature components.

8. The method of claim 5, wherein the numerical value is used as an input to the non-negative factorization.

9. The method of claim 5, wherein the feature analysis includes a principal component analysis (PCA), and the number of factors corresponds to a number of principal components.

10. The method of claim 1, wherein the NMR measurements include downhole NMR measurements or surface NMR measurements, the method further comprising applying the wettability index to the downhole NMR measurements or the surface NMR measurements of a subterranean region.

11. The method of claim 10, further comprising performing at least one of planning a downhole operation and adjusting an operational parameter of the downhole operation based on the downhole NMR measurements or the surface NMR measurements.

12. A system for estimating a wettability characteristic of a rock material, the system comprising:
    a nuclear magnetic resonance (NMR) device configured to perform NMR measurements of the rock material; and
    a processor configured to perform a method including:
        acquiring a plurality of T2 distributions based on the NMR measurements of the rock material under a plurality of fluid saturated rock conditions,
        constructing a measurement matrix based on the plurality of T2 distributions;
        performing non-negative factorization of the measurement matrix to determine feature components;
        reconstructing the plurality of T2 distributions based on the feature components, and extracting a first set of T2 distributions associated with mobile water under a wetting condition and a second set of T2 distributions associated with mobile water under a non-wetting condition; and
        calculating a wettability index (WI) based on the first extracted set of T2 distributions and the second extracted set of T2 distributions.

13. The system of claim 12, wherein calculating the wettability index includes calculating a summation of the first set of extracted T2 distributions and a summation of the second set of extracted T2 distributions, and calculating a normalized difference between the summation of the first set of extracted T2 distributions and the summation of the second set of extracted T2 distributions.

14. The system of claim 13, wherein the wettability index is calculated according to the following equations:

$$NWI_i = \frac{V_{W,w}^{NMR,i} - V_{W,nw}^{NMR,i}}{V_W^{NMR,i}}$$

$$V_W^{NMR,i} = V_{W,w}^{NMR,i} + V_{W,nw}^{NMR,i}$$

$$V_{W,w}^{NMR,i} = \sum_{j=1}^{N_{T_2}} P_{i,W_w}(T_{2,j})$$

$$V_{W,nw}^{NMR,i} = \sum_{j=1}^{N_{T_2}} P_{i,W_{nw}}(T_{2,j}),$$

Where i is the index of measurement, $T_{2,j}$ is an jth T2 relaxation time bin, $\{P_{i,W,w}(T_{2,j})\}$ is a T2 distribution of the mobile water in the wetting phase for the ith measurement, and $\{P_{i,W,nw}(T_{2,j})\}$ is a T2 distribution of the mobile water in the non-wetting phase for the ith measurement.

15. The system of claim 12, wherein the plurality of fluid saturated rock conditions are achieved by applying fluids having a plurality of fluid constituents selected from at least one of an oil-based fluid, a water-based fluid and a surfactant.

16. The system of claim 12, wherein the extracting includes performing a feature analysis on the plurality of T2 distributions to determine a numerical value corresponding to a number of factors related to variability of the plurality of T2 distributions.

17. The system of claim 12, wherein the extracting includes determining feature components of the measurement matrix, including a first feature component corresponding to oil displacing water, and a second feature component corresponding to water displacing oil.

18. The system of claim 17, wherein the plurality of T2 distributions are reconstructed using the first and second feature components.

19. The system of claim 16, wherein the numerical value is used as an input to the non-negative factorization.

20. The system of claim 16, wherein the feature analysis includes a principal component analysis (PCA), and the number of factors corresponds to a number of principal components.

* * * * *